(12) United States Patent
Liu

(10) Patent No.: US 6,188,577 B1
(45) Date of Patent: Feb. 13, 2001

(54) PROTECTIVE DEVICE FOR CENTRAL PROCESSING UNIT

(76) Inventor: Yen-Wen Liu, 13F, No. 90, Chiu-Kang Street, Wen-Shang Dist., Taipei (TW)

( * ) Notice: Under 35 U.S.C. 154(b), the term of this patent shall be extended for 0 days.

(21) Appl. No.: 09/442,451

(22) Filed: Nov. 18, 1999

(51) Int. Cl.$^7$ .................................................. H05K 7/20
(52) U.S. Cl. .......................... 361/704; 361/703; 361/710; 361/707; 361/717; 361/719; 257/718; 257/719; 257/727; 174/16.3; 165/80.3; 24/294
(58) Field of Search .................................. 361/704, 707, 361/709, 710, 715, 719–721; 165/80.2, 80.3, 185; 174/16.3; 257/706, 707, 712, 713, 718, 719–722, 727; 24/294, 458

(56) References Cited

U.S. PATENT DOCUMENTS

| | | | |
|---|---|---|---|
| 4,415,025 | * 11/1983 | Horvath | 165/185 |
| 4,745,456 | * 5/1988 | Clemens | 257/717 |
| 5,375,652 | * 12/1994 | Matsunaga et al. | 165/80.3 |
| 5,566,052 | * 10/1996 | Hughes | 361/704 |
| 5,586,005 | * 12/1996 | Cipolla et al. | 361/719 |
| 5,883,782 | * 3/1999 | Thurston et al. | 361/704 |
| 5,883,783 | * 3/1999 | Turturro | 361/704 |
| 6,055,159 | * 4/2000 | Sun | 361/704 |

* cited by examiner

Primary Examiner—Leo P. Picard
Assistant Examiner—Boris L. Chervinsky
(74) Attorney, Agent, or Firm—Bacon & Thomas PLLC

(57) ABSTRACT

A protective device for a central processing unit contains a supporter disposed on a central processing unit (CPU), wherein a window is formed in the central portion of the supporter; a plurality of predetermined support spring pieces are formed around the window for holding a heat sink to contact the CPU in a stable manner so that the heat produced by the CPU can be efficiently conducted to the heat sink.

1 Claim, 3 Drawing Sheets

PROTECTIVE DEVICE FOR CENTRAL PROCESSING UNIT

BACKGROUND OF THE INVENTION

This invention relates generally to a protective device for a central processing unit, and particularly to a protective device for mounting a heat sink on a central processing unit (CPU) in a stable manner for conducting the heat created from the CPU to the heat sink.

In view of the trend that design of computer and related products is moving towards minimization in weight and volume, and accordingly the chip of the central processing unit (CPU) is also made smaller, this invention provides an improved structure in compliance with this trend.

As shown in FIG. 1, combined structure of a prior heat sink and a central processing unit. A heat sink A is placed on a CPU C to contact a top face thereof by retaining in the way a fastener B of a fin set A1 being buckled to a fastening piece D1 in a socket D of the CPU C. However, as the chip of the CPU C becomes smaller and smaller, the contact area between an existing heat sink and the top face of the CPU C also becomes smaller too. Thus, when buckling the heat sink to the CPU C, an imbalance support force will cause the heat sink to slant and lose solid contact with the chip. This results in degraded heat dissipating and possible impairment of the CPU C which may become disabled or even burnt down finally.

From the abovesaid, the disadvantages of the existing combination structure may be summarized as the following:

1. The existing structure can no longer fit the smaller-sized CPU owing an imbalance in support force that causes a slant of the heat sink and failure of normal heat dissipating operation.

2. The imbalance support force will impair the CPU by an imbalance of pressure applied by the heat sink.

3. As the contact area of the structure is lessened, a careful buckling measure becomes necessary, which requires more time and cost.

4. A slight impact may result in a poor contact between the heat sink and the CPU.

For improvement, this invention mounts a supporter between the heat sink and the CPU to obtain a stable and constant contact at their junction for conducting away heat of the CPU efficiently.

SUMMARY OF THE INVENTION

The primary object of this invention is to provide a protective device for a central processing unit (CPU) by mounting an extra supporter on a CPU, wherein a window is formed in a central portion of the supporter, and a plurality of predetermined support spring pieces is disposed around the window for holding a heat sink in a stable position.

Another object of this invention is to provide a protective device that can conduct the heat created by the CPU to a heat sink efficiently.

DETAILED DESCRIPTION OF THE PREFERRED EMBODIMENT

Figure 1:
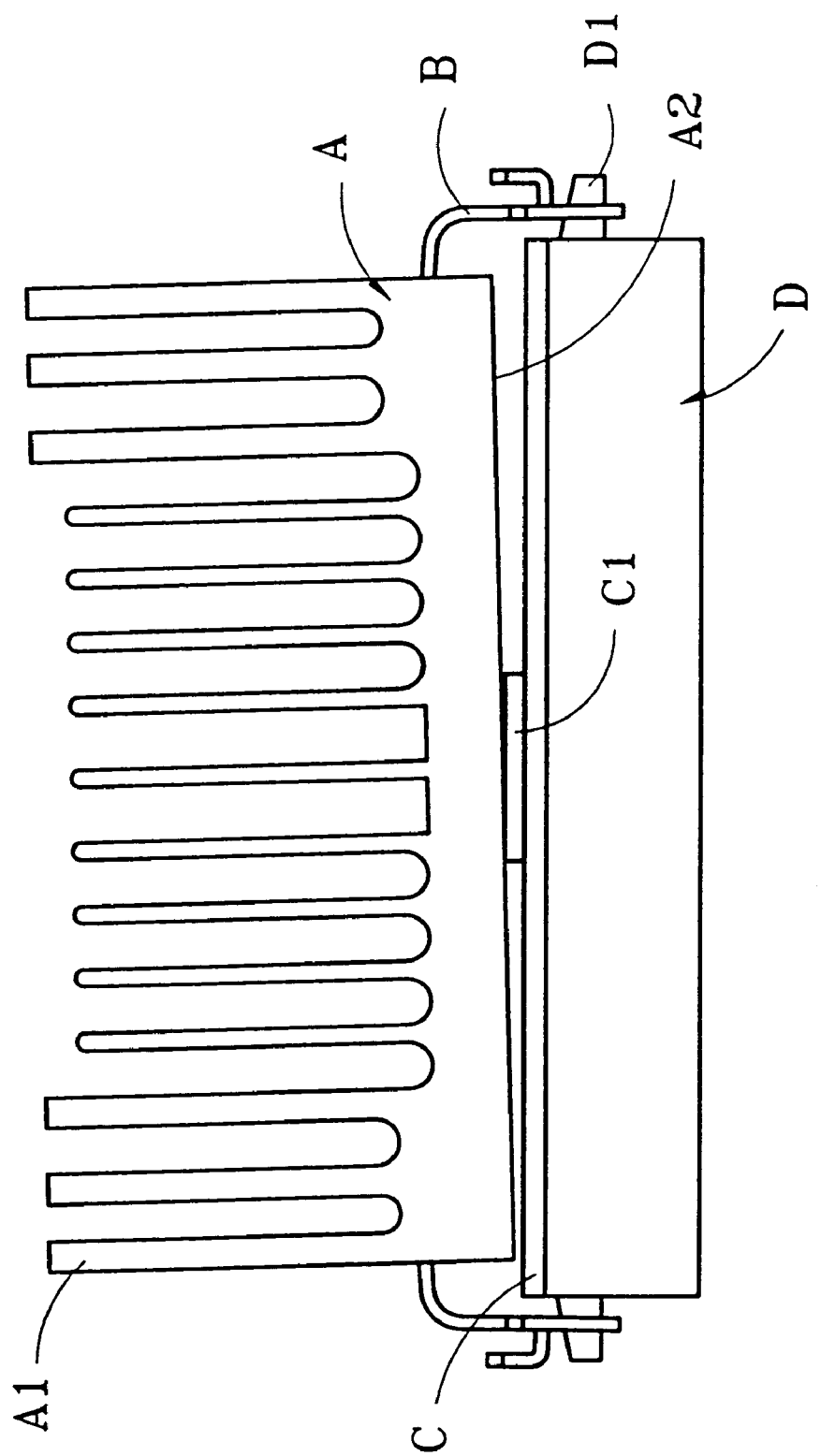
FIG. 1 is an elevational view showing a combined structure of a conventional heat sink and a CPU.
Figure 2:
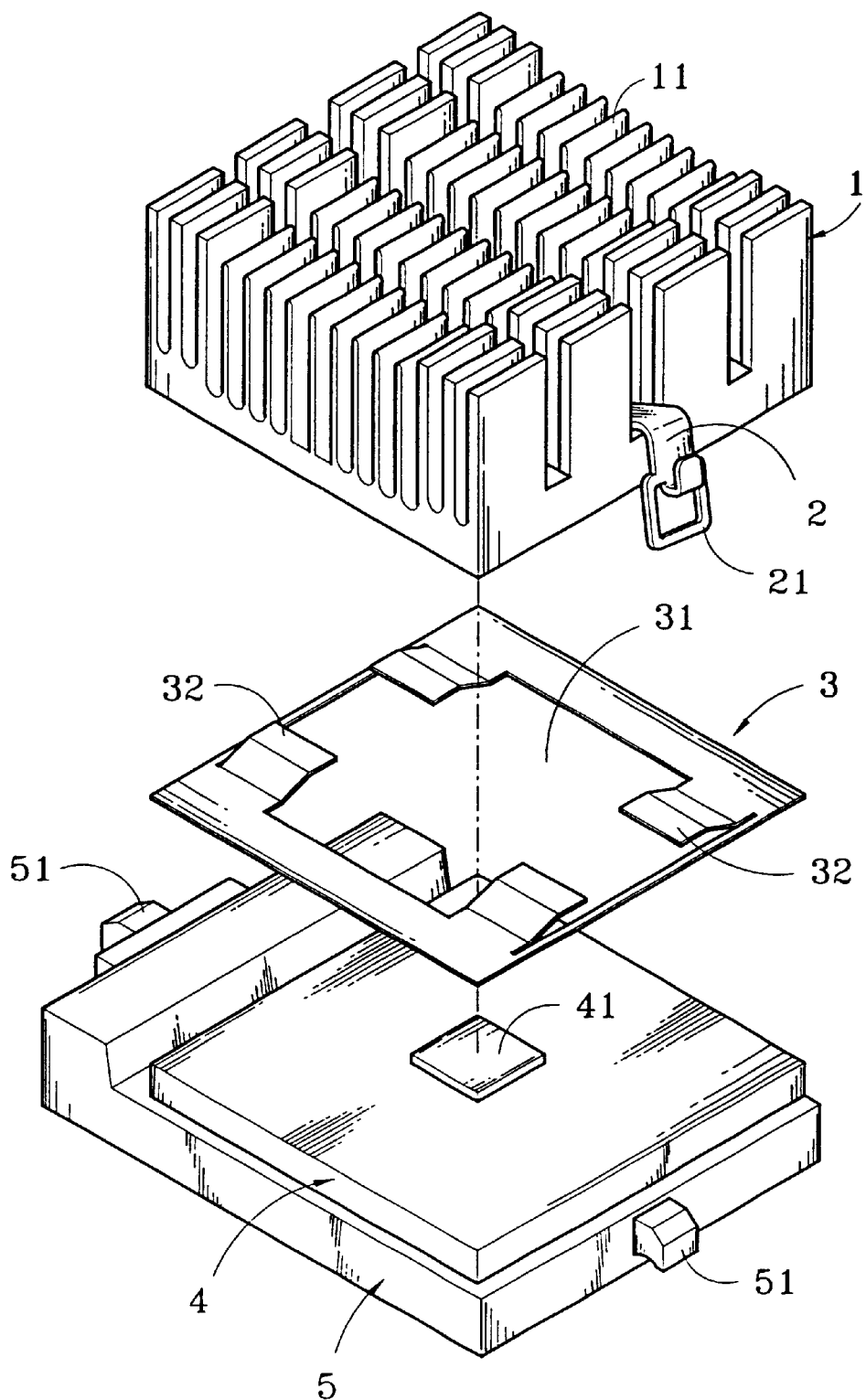
FIG. 2 is an exploded perspective view of the CPU and the invention.

As shown in FIG. 2, a fastener 2 is located in a fin forest 11 of a heat sink 1, and a central processing unit (CPU) 4 is plugged in a socket. A supporter 3 is placed on the top face of the CPU 4, wherein the chip 41 of the CPU 4 is located at a central portion in a window 31 surrounded by a rectangular supporter 3. The heat sink 1 is laid on the CPU 4 and fixed by buckling a buckle 21 of the fastener 2 to a fastening piece 51 on opposite sides of the socket 5.

Figure 3:
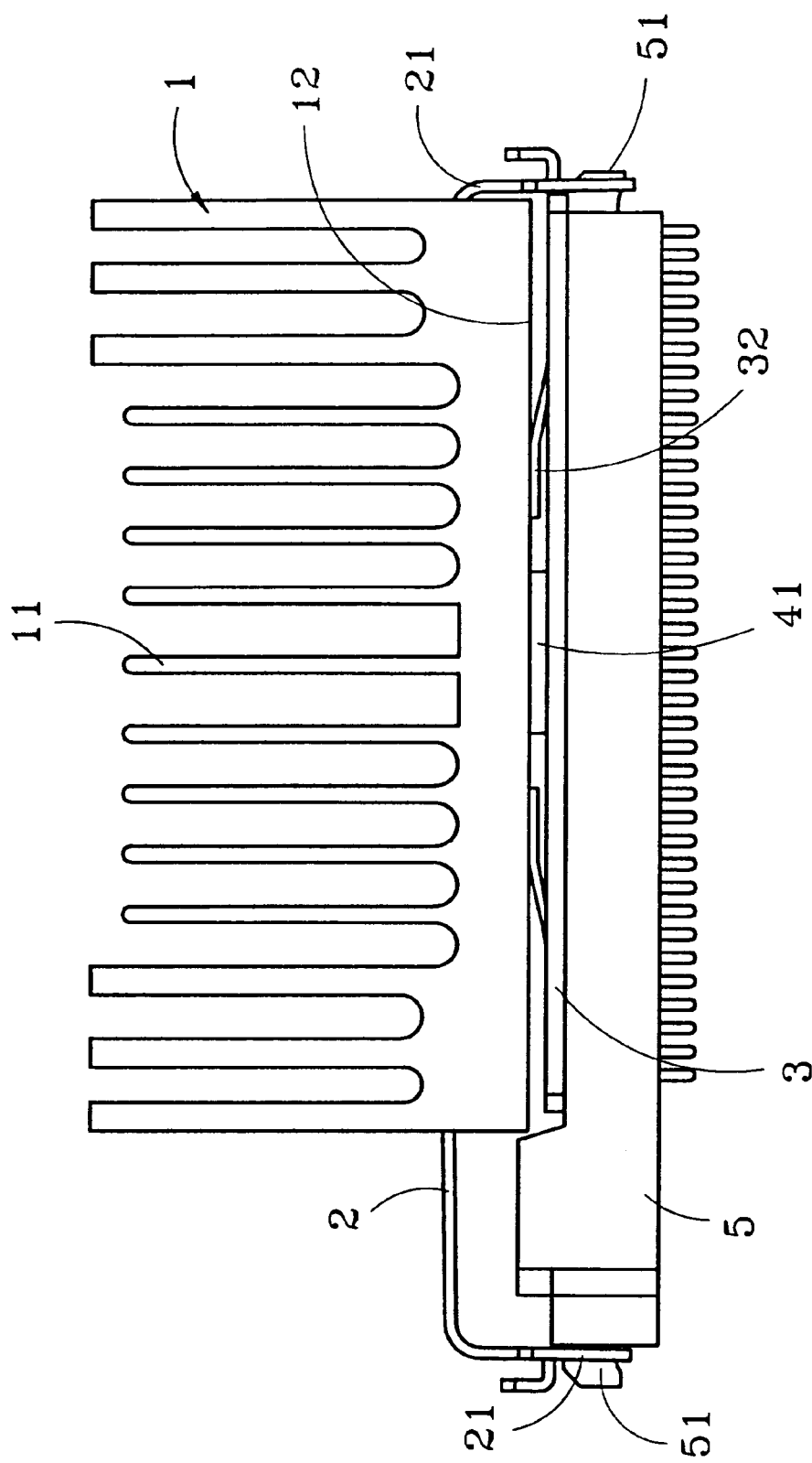
FIG. 3 is an elevational view of a combined structure of the CPU and the invention.

A lateral view of a combined structure of a CPU and this invention is shown in FIG. 3. After the fastener 2 of the heat sink 1 is buckled with the fastening piece 51 of the socket 5, a contact face 12 of the heat sink 1 will contact with the top face of the chip 41 of the CPU 4 and a plurality of inwardly and upwardly directed support spring pieces 32 of the supporter 3 presses against the bottom contact face 12 of the heat sink 1.

The plurality of support spring member 32 is spaced around the window 31 and used to support and maintain the heat sink 1 in a stable position so that the contact face 12 of the heat sink 1 will remain in full contact with the top face of the chip 41 of the CPU 4 for conducting the heat produced by the CPU 4 efficiently to the heat sink 1, no matter how small the chip 41.

In short, this invention is to provide a protective device for a central processing unit by placing a supporter on a CPU so that stable and constant contact between a heat sink and the CPU chip is maintained to conduct heat of the CPU efficiently to a heat sink.

To conclude the abovesaid, the merits of this invention may be summarized as follows:

1. This invention is applicable to a small-sized chip of a CPU without creating an imbalance force to avoid slanting a heat sink on the chip of a CPU.

2. The plurality of support spring pieces of this invention are capable of balancing the support force without slanting the heat sink so that the chip of the CPU will not be impaired by the heat sink.

3. This invention requires no extra time for buckling in the case of a small contact area to thus save time and assembling cost.

4. After being assembled, no poor contact of the combined structure of the heat sink and the CPU will be incurred by a slight impact by virtue of the support spring pieces.

Although, this invention has been described in terms of preferred embodiments, it is apparent that numerous variations and modifications may be made without departing from the true spirit and scope thereof, as set forth in the following claims.

What is claimed is:

1. A protective device for maintaining full engagement between a chip on a top surface of a CPU and a bottom contact face of a heat sink secured to the CPU by a fastener assembly, the device comprising:

a supporter defined by an outer peripheral portion for disposition on the top surface of the CPU and a central window portion for engagement of the chip therethrough by the bottom contact face of the heat sink; and a plurality of spring members spaced around the outer peripheral portion, each spring member extending inwardly from the peripheral portion and into the central window portion for engagement against the bottom contact surface of the heat sink to maintain the bottom contact surface in full engagement with a top surface of the chip and thereby permit heat produced by the chip to be efficiently and continuously conducted to the heat sink.

* * * * *